United States Patent
Jeong

[11] Patent Number: 5,853,484
[45] Date of Patent: Dec. 29, 1998

[54] GAS DISTRIBUTION SYSTEM AND METHOD FOR CHEMICAL VAPOR DEPOSITION APPARATUS

[75] Inventor: Kyung Cheol Jeong, Kyungsangbook-Do, Rep. of Korea

[73] Assignee: LG Semicon Co., Ltd., Choongcheongbuk-Do, Rep. of Korea

[21] Appl. No.: 727,903

[22] Filed: Oct. 9, 1996

[30] Foreign Application Priority Data

Oct. 28, 1995 [KR] Rep. of Korea .................. 1995 37891

[51] Int. Cl.⁶ .................................................... C23C 16/00
[52] U.S. Cl. ........................ 118/715; 118/723 E; 118/712
[58] Field of Search .................. 118/715, 723 E, 118/712, 713

[56] References Cited

U.S. PATENT DOCUMENTS

| | | | |
|---|---|---|---|
| 4,627,989 | 12/1986 | Feuerstein et al. | 427/10 |
| 4,980,204 | 12/1990 | Fujii et al. | 427/255.2 |
| 5,143,896 | 9/1992 | Harada et al. | 505/1 |
| 5,269,847 | 12/1993 | Andersom et al. | 118/715 |
| 5,310,410 | 5/1994 | Begin et al. | 29/25.01 |
| 5,496,408 | 3/1996 | Motoda et al. | 118/715 |
| 5,500,256 | 3/1996 | Watabe | 427/579 |
| 5,540,783 | 7/1996 | Eres et al. | 118/725 |
| 5,588,995 | 12/1996 | Sheldon | 117/201 |
| 5,608,526 | 3/1997 | Piwonka-Corle et al. | 356/369 |
| 5,628,829 | 5/1997 | Foster et al. | 118/723 E |
| 5,665,214 | 9/1997 | Iturradalde et al. | 204/298.03 |
| 5,683,517 | 11/1997 | Shan | 118/723 E |

FOREIGN PATENT DOCUMENTS

| | | |
|---|---|---|
| 3-170675 | 7/1991 | Japan . |
| 3-281780 | 12/1991 | Japan ..................................... 118/715 |

OTHER PUBLICATIONS

Jackson, Computer Control of epitaxail Production Systems, Solid State Technology, pp. 35–39, Nov. 1972.
Burggraaf, Cluster Tools for 1990's Chips, Semiconductor Internation, pp. 56–63, Aug. 1990.

*Primary Examiner*—Robert Kunemund
*Assistant Examiner*—Jeffrie R. Luno

[57] ABSTRACT

A gas distribution system for a chemical vapor deposition (CVD) apparatus includes a main gas supply pipe for receiving gas from a gas supply, a manifold communicated to the main gas supply pipe and having a plurality of sub-pipes, a plurality of gas metering valves provided at each of the sub-pipes so as to control gas amount flowing therein from each of the sub-pipes, a gas distribution head communicating with each of the sub-pipes so as to collectively jet gas therefrom, a control unit for outputting control signals to each of the gas control valves, and an N-point scanner electrically connected to input terminals of the control unit. The gas distribution system improves deposition uniformity by adjusting the thickness of a film deposited on a wafer in accordance with scanning information from the N-point scanner.

10 Claims, 3 Drawing Sheets

GAS DISTRIBUTION SYSTEM AND METHOD FOR CHEMICAL VAPOR DEPOSITION APPARATUS

BACKGROUND OF THE INVENTION

1. Field of the Invention

The present invention relates to a gas distribution system, and more particularly to a gas distribution system for a chemical vapor deposition (hereinafter, "CVD") apparatus capable of controlling through a gas control valve the amount of gas being jetted onto a semiconductor wafer mounted on a heater plate, thereby improving the deposition uniformity of a material deposited on the wafer.

2. Description of the Conventional Art

Chemical vapor deposition (CVD) is a technique for forming a thin film on a substrate by distributing a reaction gas to a semiconductor wafer, etc. provided inside a chamber, and causing a chemical reaction of the gas in the chamber.

As shown in FIG. 1, a conventional CVD apparatus includes a chamber 1 of a certain volume. A heater plate 2 is provided in the chamber 1. At an upper portion in the chamber 1, is communicated to a shower head 3 is provided which communicates with a gas supply pipe 6. In a lower portion of the chamber 1, an exhaust pipe 4 is provided for exhausting gas from the chamber 1. Vacuum pump 5 is connected to the exhaust pipe 4 for generating a vacuum in the chamber 1. An RF generator 7 is provided outside and adjacent to the chamber 1.

The operation of the thusly composed conventional chemical vapor deposition apparatus will now be described.

First, a wafer W is mounted on the upper surface of the heater plate 2 using a wafer transfer (not shown). The chamber 1 is put under a vacuum using the vacuum pump 5. Gas flowing from an external gas container (not shown) passes through the gas supply pipe 6 and the shower head 3 sequentially and is jetted onto the wafer W. The gas passing through the supply pipe 6, such as $SiH_4$ or $NH_3$, is jetted therefrom through a plurality of holes (not shown) formed in the lower surface of the shower head 3.

Meanwhile, the chamber 1 is electrically coupled to the RF generator 7. When electric current is supplied to the RF generator 7, an RF electric field is formed in the chamber 1 and excites the gas molecules jetted into the chamber 1 into a plasma or an ionized state. The heater plate 2 serves to increase to a certain degree the temperature of the wafer w positioned thereon. Subsequently, a chemical reaction of the plasma gas in the chamber 1 forms an oxide film ($SiO_2$) or a nitride film ($Si_2N_3$) on the wafer W.

However, the previously described conventional CVD apparatus has disadvantages in that the multiple holes formed in the shower head may prevent the reaction gas from being properly dispersed onto a wafer larger than 12' in diameter. Accordingly, the desired thin film may be non-uniformly deposited on the wafer.

SUMMARY OF THE INVENTION

Therefore, it is an object of the present invention to provide a gas distribution system for a chemical vapor deposition (CVD) apparatus capable of improving deposition uniformity by properly jetting gas on a wafer.

To achieve the above-described object, a gas distribution system for a chemical vapor deposition (CVD) apparatus having a chamber includes a main gas supply pipe for receiving gas from an external supply, a manifold communicating with the main gas supply pipe and having a plurality of sub-pipes, a gas metering valve provided at each of the sub-pipes so as to control the gas amount flowing therein, a gas distribution head provided on each of the sub-pipes so as to jet gas therefrom, a control unit for outputting control signals to the gas metering valves, and an N-point scanner electrically connected to the control unit.

DETAILED DESCRIPTION OF THE PREFERRED EMBODIMENT

Figure 1:
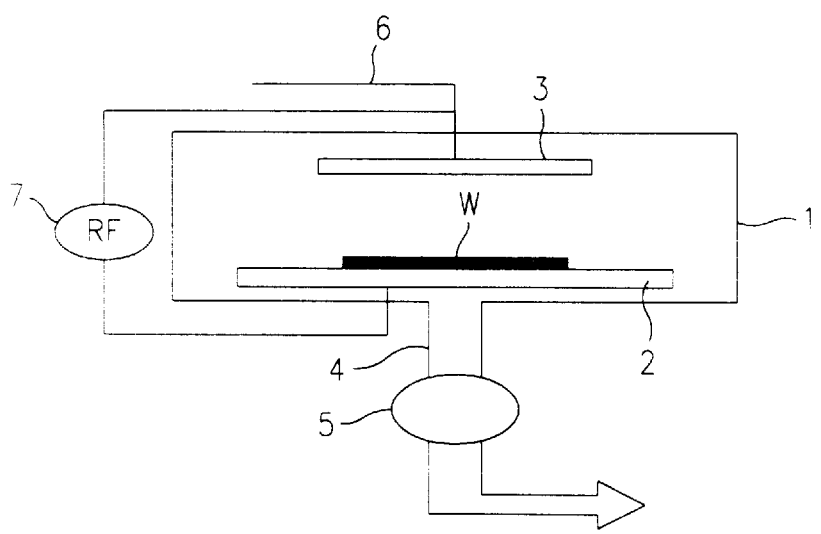
FIG. 1 is a schematic view of a conventional CVD apparatus.
Figure 2:
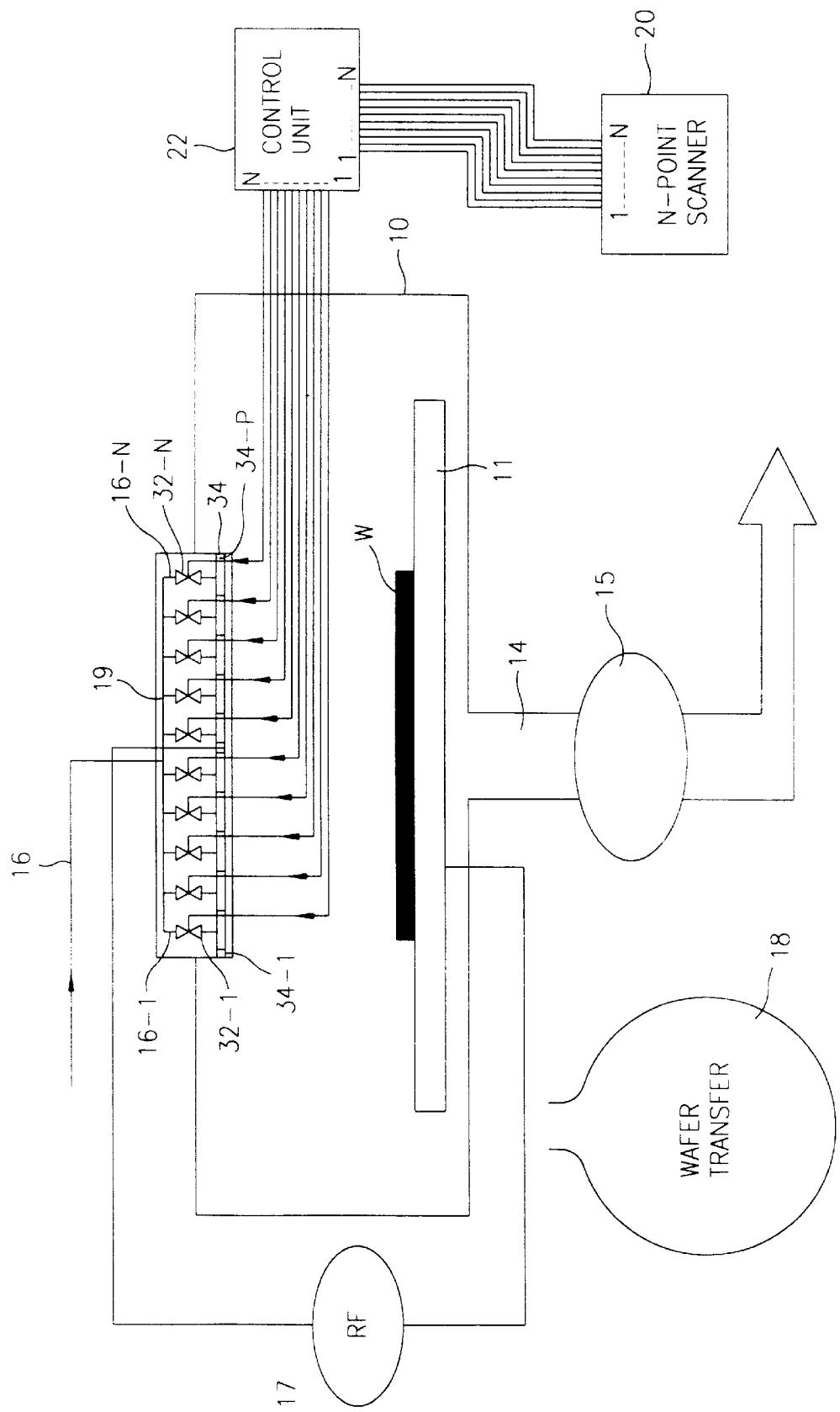
FIG. 2 is a schematic view of a gas distribution system for a CVD apparatus according to the present invention.

With reference to FIG. 2, the CVD apparatus according to the present invention includes a chamber 10. Inside the chamber 10 a heater plate 11 is provided. A gas distribution head 34 partitioned into a plurality P of cells, each having a gas discharge outlet therein, is provided in the ceiling of the chamber 10.

A main gas supply pipe 16 for supplying gas into the chamber 10 branches to a manifold 19 consisting of a plurality N of sub-pipes 16-1, . . . , 16-N, each of which has a corresponding one of a plurality N of gas metering valves 32-1, . . . , 32-N installed therein.

Each cell 34-1 to 34-P of the gas distribution head 34 is communicates with an end of a respective one of the sub-pipes 16-1, . . . , 16-N. The number of cells P in the gas distribution head 34 is not less than the number of sub-pipes N ($P \geq N$).

Figure 3:
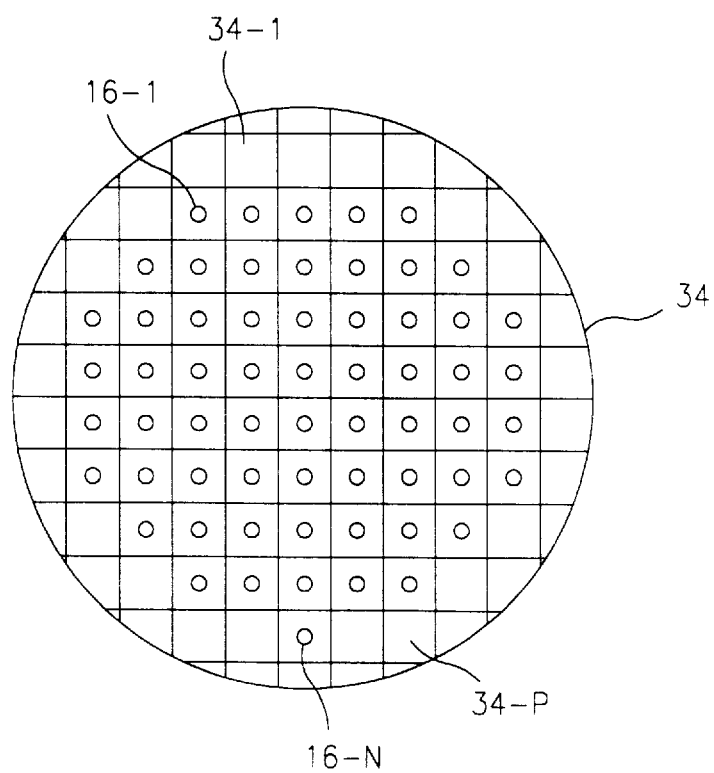
FIG. 3 is a plan view of a gas distribution head of the CVD apparatus in accordance with the present invention.

As further shown in FIG. 3, the gas distribution head 34 is divided into P multiple cells 34-1 to 34-P, each of which communicates with an end of a respective one of the sub-pipes 16-1, . . . , 16-N.

With reference to FIG. 2, the servo metering valves 32-1, . . . , 32-N are electrically connected to corresponding output terminals of a control unit 22. Input terminals of the control unit 22 are electrically connected to an N-point scanner 20.

The chamber 10 also includes a wafer transfer device 18 serving to load/unload wafers W into/from the chamber 10.

At a lower surface of the chamber 10, an exhaust pipe 14 is connected which communicates with a vacuum pump 15 for creating a vacuum within the interior of the chamber 10.

The operation and effect of the thusly composed gas distribution system for a CVD apparatus will now be explained, as follows.

First, using the conventional wafer transfer device 18 (of which a detailed description is omitted), a wafer W is transferred onto the heater plate 11. The interior of the chamber 10 is put under a vacuum using the vacuum pump 15. The heater plate 11 (which is preheated to a certain temperature) heats the wafer w up to an appropriate temperature. Gas such as $SiH_4$ or $NH_3$ is drawn from an external supply (not shown) through the main supply pipe 16 to each of the sub-pipes 16-1, . . . 16-N. The amount of gas flowing through the sub-pipes is adjusted by the servo gas metering valves 32-1, . . . 32-N. The is therefore jetted into the chamber 10 through the gas distribution head 34.

When the RF generator 17 which is electrically coupled to the chamber 10 is charged with electric current, an electric field is induced in the chamber 10. Subsequently, gas molecules jetted into the chamber 10 are ionized and the ionized plasma is chemically deposited on the wafer W, thereby forming an oxide film $SiO_2$ or a nitride film $Si_2N_3$ on the wafer W.

When a desired deposition on the wafer W is completed, the wafer W is unloaded and externally transferred by the wafer transfer device 18. Then, the thickness at each of the N points of the film deposited on the wafer W is measured by the N-pointer scanner 20. The N-point scanner 20 serves to send to the control unit 22 signals in accordance with the measured data. The control unit 22 compares the data signals received from the N-point scanner 20 and reference data signals stored therein and sends control signals in accordance with the comparison to each of the servo gas metering valves 32-1, . . . , 32-N. That is, to obtain uniformity in the thickness of the film deposited on the wafer W, the servo metering valves 32-1, . . . , 32-N are controlled to distribute more gas onto a wafer portion having a relatively thinner deposition film, but less gas onto a wafer portion having a relatively thicker deposition film, whereby the servo gas metering valves 32-1, . . . , 32-N cause the gas amount being flowed therein to appropriately increase or decrease in accordance with the control signals from the control unit 22.

As described above, the gas distribution system for a CVD apparatus in accordance with the present invention has the advantages in that thickness of the film deposited on the wafer can be adjusted by means of comparing the thickness value measured by the N-point scanner to reference data values and controlling the servo gas metering valves and thus the amount of the distributed gas, thereby improving the deposition uniformity.

Although the present invention has been described and illustrated above according to a preferred embodiment thereof, a person of ordinary skill in the art can modify the invention within the scope thereof which is intended to be limited only by the claims.

What is claimed:

1. A gas distribution system for a chemical vapor disposition (CVD) apparatus having a deposition chamber, the system comprising, a gas supply pipe;

a plurality of gas supply sub-pipes communicating with said gas supply pipe;

a plurality of metering valves each associated with a respective one of said plurality of gas supply sub-pipes for controlling a flow of a gas therethrough;

a gas distribution head for jetting the gas therefrom, said gas distribution head having a plurality of cell gas discharge outlets arranged on a rectangular matrix, each communicating with a respective one of said plurality of gas supply sub-pipes;

a control unit for individually controlling said plurality of metering valves; and a scanner connected with said control unit and being constructed and arranged to detect a thickness of a film deposited by CVD on a workpiece at a plurality of points on the deposited film, each point corresponding in location to a respective one of said plurality of cell gas discharge outlets, and to pass said thickness information on to said control unit, wherein said control unit is constructed and arranged to compare said thickness information corresponding to gas distribution with reference data, and output control signals to said plurality of metering valves according to the comparison, whereby the gas flow to each said cell gas discharge outlet is controlled.

2. The gas distribution system of claim 1, wherein said control unit provides independent control signals to each of said metering valves.

3. The gas distribution system of claim 1, wherein said scanner is constructed and arranged to determine a thickness of a film deposited by chemical vapor deposition on a workpiece in the deposition chamber at a plurality of points on the deposited film, after the workpiece is removed from the deposition chamber.

4. The gas distribution system of claim 3, wherein said workpiece is a semiconductor wafer.

5. The gas distribution system of claim 1, wherein said plurality of gas discharge outlets are arranged on a square matrix.

6. A chemical vapor deposition (CVD) apparatus for depositing a thin film on a workpiece, the apparatus comprising:

a deposition chamber;

a gas distribution system comprising:
      a gas supply pipe connected to a gas source;
      a plurality of gas supply sub-pipes each communicating with said gas supply pipe;
      a plurality of metering valves each associated with a respective said gas supply sub-pipe;
      a gas discharge head located within said deposition chamber and being provided with a plurality of gas cell discharge outlets arranged on a rectangular matrix, each said gas cell discharge outlet being associated with a respective said gas supply sub-pipe; and
      a control unit constructed and arranged to individually control said plurality of metering valves;

a scanner connected to said control unit and constructed and arranged to inspect a thickness of the deposited thin film at a plurality of locations on the workpiece, said control unit being constructed and arranged to individually control said plurality of metering valves in accordance with a comparison between said inspection information received from said scanner with reference data; and a power source electrically connected to said deposition chamber and being constructed and arranged to ionize a gas in said deposition chamber.

7. The CVD apparatus of claim 6, wherein said scanner is constructed and arranged to inspect a thickness of the deposited thin film at a number of locations on the workpiece equal to a number of cell gas discharge outlets.

8. The CVD apparatus of claim 6, wherein said scanner is constructed and arranged to inspect a thickness of the deposited thin film at a plurality of locations on the workpiece, after the workpiece is removed from said deposition chamber.

9. The CVD apparatus of claim 8, wherein said workpiece is a semiconductor wafer.

10. A method of distributing a gas in a chemical vapor deposition apparatus in which, in a deposition chamber, the gas is ionized and deposited on a workpiece as a film, the method comprising the steps of:

providing the gas to a plurality of gas supply sub-pipes, each of the sub-pipes being associated with a respective metering valve;

dispersing the gas into the deposition chamber through a plurality of cell gas discharge outlets provided in a gas distribution head, each of the cell gas discharge outlets corresponding to a respective one of the plurality of gas sub-pipes;

detecting a thickness of the film deposited on the workpiece at a plurality of locations on the workpiece, each said thickness corresponding to a gas flow from a respective said cell gas discharge outlet, and comparing each said thickness to a corresponding reference value; and individually controlling the metering valves in accordance with the comparison made in said step of comparing the information and the reference value, thereby controlling gas flow through the respective cell gas discharge outlets.

* * * * *